(12) United States Patent
Park

(10) Patent No.: US 10,036,917 B2
(45) Date of Patent: Jul. 31, 2018

(54) DISPLAY DEVICE

(71) Applicant: Samsung Display Co., Ltd., Yongin-Si, Gyeonggi-Do (KR)

(72) Inventor: Sung-dong Park, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/475,590

(22) Filed: Mar. 31, 2017

(65) Prior Publication Data

US 2017/0343852 A1   Nov. 30, 2017

(30) Foreign Application Priority Data

May 26, 2016 (KR) .................. 10-2016-0065048

(51) Int. Cl.
*G02F 1/1333* (2006.01)
*G02F 1/1335* (2006.01)
*H01L 27/32* (2006.01)
*H01L 51/52* (2006.01)

(52) U.S. Cl.
CPC .... *G02F 1/133512* (2013.01); *G02F 1/13338* (2013.01); *H01L 27/323* (2013.01); *H01L 51/5284* (2013.01); *G02F 2001/133388* (2013.01); *G02F 2202/28* (2013.01)

(58) Field of Classification Search
CPC ............ G02F 1/133528; G02F 1/1333; G02F 1/133512
See application file for complete search history.

(56) References Cited

U.S. PATENT DOCUMENTS

2012/0200796 A1 * 8/2012 Harayama ......... G02F 1/133308
349/43
2014/0256842 A1   9/2014 Kobayashi et al.

FOREIGN PATENT DOCUMENTS

| KR | 101365782 B1 | 2/2014 |
| KR | 101383207 B1 | 4/2014 |
| KR | 1020140073422 A | 6/2014 |

* cited by examiner

*Primary Examiner* — Phu Vu
(74) *Attorney, Agent, or Firm* — Cantor Colburn LLP

(57) ABSTRACT

A display device include a display panel with first and second substrates facing each other, a window part provided on the display panel and including a light-blocking region provided at an edge region thereof, an adhesive part provided between the display panel and the window part, and a plurality of optical patterns provided on an edge region of a bottom surface of the first substrate.

20 Claims, 11 Drawing Sheets

DISPLAY DEVICE

This application claims priority to Korean Patent Application No. 10-2016-0065048, filed on May 26, 2016, and all the benefits accruing therefrom under 35 U.S.C. § 119, the content of which in its entirety is herein incorporated by reference.

BACKGROUND

Exemplary embodiments of the invention relate to a display device, and in particular, to a display device in which a substrate of a display panel is configured to have optical patterns.

A variety of display devices such as a liquid crystal display device ("LCD"), a plasma display device ("PDP"), an organic light emitting display device ("OLED"), a field effect display device ("FED"), and an electrophoretic display device, are used to display image information.

The display device includes a display panel for displaying an image and a window for protecting the display panel. The window is coupled to the display panel by an optically transparent adhesive part.

SUMMARY

Some exemplary embodiments of the invention provide a display device which is configured to improve a curing property of an adhesive part provided below a light blocking layer of a window part.

Some exemplary embodiments of the invention provide a display device which is configured to increase an amount of ultraviolet light incident into the adhesive part provided below the light blocking layer of the window part and thereby to improve an adhesion property between the window part and the display panel.

According to some exemplary embodiments of the invention, a display device includes a display panel in which first and second substrates facing each other are provided, a window part provided on the display panel, an adhesive part provided between the display panel and the window part, and a plurality of optical patterns provided on an edge region of a bottom surface of the first substrate. The window part includes a light-blocking region provided at an edge region thereof.

In some exemplary embodiments, the optical patterns may be disposed on a region of the first substrate, which corresponds to the light-blocking region. The optical patterns may be disposed to overlap the adhesive part along a thickness direction of the adhesive part.

In some exemplary embodiments, the display panel may include a display area and a non-display area adjacent to the display area, and the optical patterns may be provided on a region of the first substrate, which corresponds to the non-display area.

In some exemplary embodiments, the optical patterns may be recess patterns which are defined in the bottom surface of the first substrate.

In some exemplary embodiments, the recess patterns may be filled with an optical resin whose refractive index is different from that of the first substrate. The optical resin may include at least one of a $TiO_2$ particle or a $SiO_2$ particle.

In some exemplary embodiments, the optical patterns may be protruding patterns which protrude from the bottom surface of the first substrate.

In some exemplary embodiments, the protruding patterns and the first substrate may be a single body.

In some exemplary embodiments, the protruding patterns may include an optical resin whose refractive index is different from that of the first substrate. The optical resin may include at least one of a $TiO_2$ particle or a $SiO_2$ particle.

In some exemplary embodiments, each of the optical patterns may have at least one of semi-circular, semi-elliptical, or polygonal section, on a plane normal to the bottom surface of the first substrate.

In some exemplary embodiments, the first substrate may include at least one of first and second inclined surfaces, which are respectively defined near corners of top and bottom surfaces of the first substrate.

In some exemplary embodiments, the first inclined surface may be inclined at an angle of about 120 to about 150 degrees, relative to the top surface of the first substrate.

In some embodiments, the second inclined surface may be inclined at an angle of about 30 to about 60 degrees, relative to the top surface of the first substrate.

In some exemplary embodiments, the display device may further include a touch sensing unit provided between the display panel and the adhesive part.

In some exemplary embodiments, the display panel may include a liquid crystal display panel including a liquid crystal layer provided between the first and second substrates.

In some exemplary embodiments, the display panel may be an organic light emitting display panel, and the first substrate may be an encapsulation substrate.

BRIEF DESCRIPTION OF THE DRAWINGS

The above and other advantages and features of this disclosure will be more clearly understood from the following brief description taken in conjunction with the accompanying drawings. The accompanying drawings represent non-limiting, exemplary embodiments as described herein.

Figure 1:
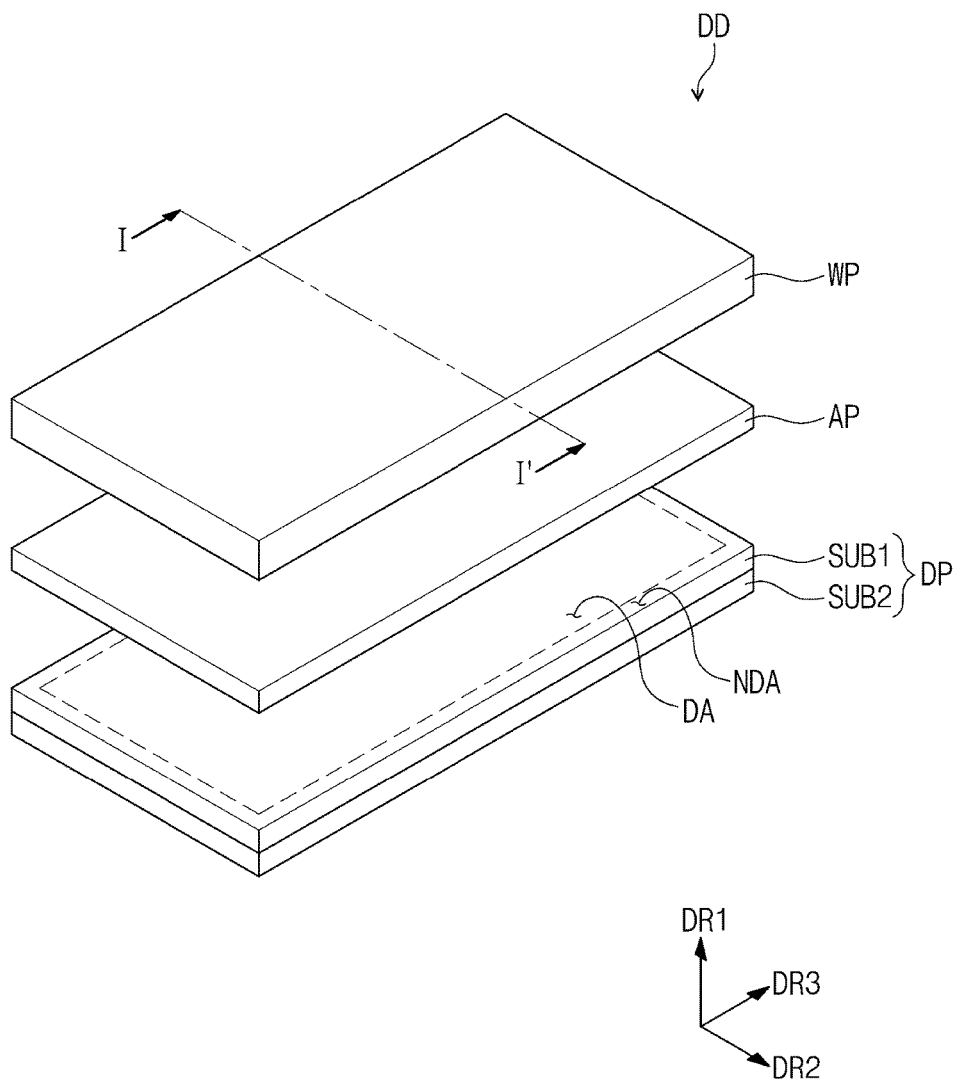
FIG. 1 is an exploded perspective view of an exemplary embodiment of a display device.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given exemplary embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Exemplary embodiments of the invention will now be described more fully with reference to the accompanying drawings, in which exemplary embodiments are shown. Exemplary embodiments of the invention may, however, be embodied in many different forms and should not be construed as being limited to the exemplary embodiments set forth herein; rather, these exemplary embodiments are provided so that this disclosure will be thorough and complete, and will fully convey the concept of exemplary embodiments to those of ordinary skill in the art. In the drawings, the thicknesses of layers and regions are exaggerated for clarity. Like reference numerals in the drawings denote like elements, and thus their description will be omitted.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

It will be understood that when an element is referred to as being "on" another element, it can be directly on the other element or intervening elements may be present therebetween. In contrast, when an element is referred to as being "directly on" another element, there are no intervening elements present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
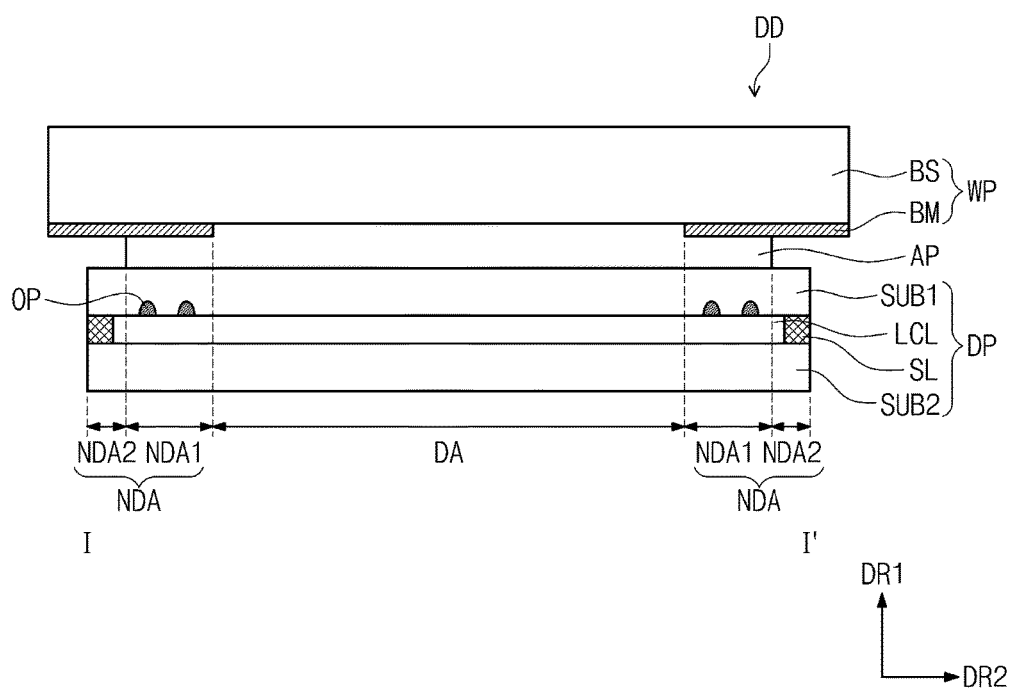
FIG. 2 is a sectional view showing an exemplary embodiment of a display device, taken along line I-I' of FIG. 1.
Figure 3:
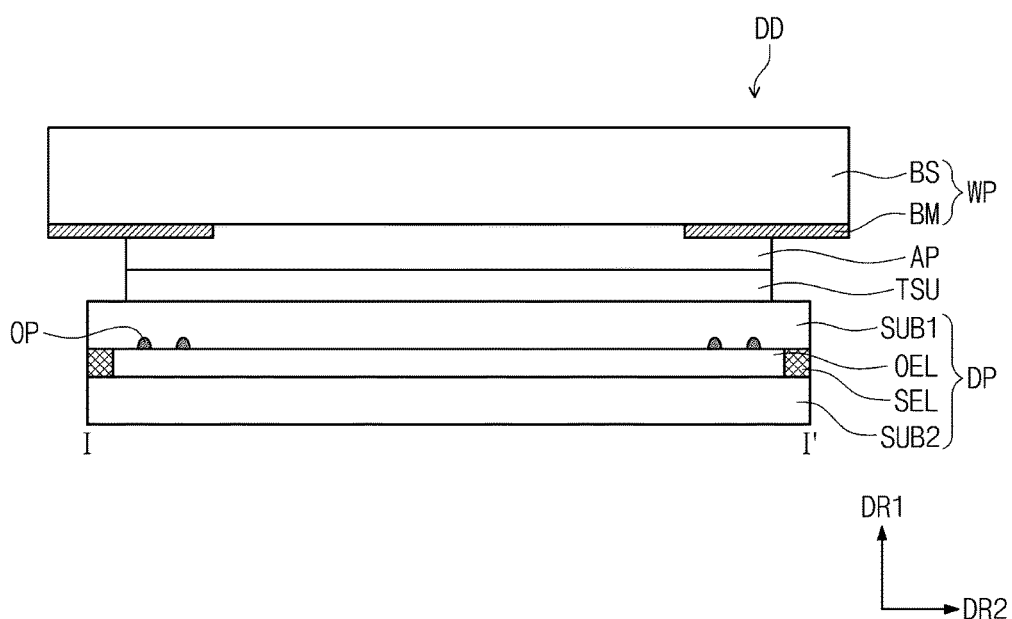
FIG. 3 is a sectional view showing another exemplary embodiment of a display device, taken along line I-I' of FIG. 1.

Hereinafter, display devices according to exemplary embodiments of the invention will be described with reference to the accompanying drawings. FIG. 1 is an exploded perspective view of an exemplary embodiment of a display device DD. FIGS. 2 and 3 are sectional views illustrating the display device DD. More specifically, FIGS. 2 and 3 are sectional views of exemplary embodiments of the display device DD taken along line I-I' of FIG. 1.

Referring to FIGS. 1 and 2, the display device DD may include a display panel DP, a window part WP, an adhesive part AP disposed between the display panel DP and the window part WP, and a plurality of optical patterns OP provided on a bottom surface of a first substrate SUB1 included in the display panel DP.

The display panel DP may have a top surface facing the window part WP and may be configured to display an image on the top surface. In an exemplary embodiment, for example, the display panel DP may be configured to emit light constituting the image toward a first direction DR1. The display panel DP, the window part WP, and the adhesive part AP may be disposed in a plane defined by a second direction DR2 and a third direction DR3 perpendicular to the second direction DR2, and a thickness direction of these elements may be defined in the first direction DR1 perpendicular to the second and third directions DR2 and DR3. As shown in FIG. 1, the display panel DP may include a display area DA which is used to display an image, and a non-display area NDA through which an image is not displayed. The non-display area NDA may be provided near the display area DA.

FIG. 1 illustrates an example in which the non-display area NDA is provided along or around a circumference of the display area DA. However, the inventive concept may not be limited thereto. In another exemplary embodiment, for example, the non-display area NDA may be provided within at least a portion of a circumferential region surrounding the display area DA. As an example, the non-display area NDA may be provided at a side of the display area DA. In still another exemplary embodiments, the non-display area NDA may be omitted, for example.

The display panel DP may have a flexible property. Here, the term "flexible" will be used to express that the display panel DP is foldable or bendable enough to have a curvature radius from several angstroms to several centimeters. In some exemplary embodiments, the display panel DP may be a curved display panel or a foldable display panel, for example. In other exemplary embodiments, at least a portion or the entire of the display panel DP may have a rigid property.

In some exemplary embodiments, the display panel DP may be a liquid crystal display panel, an organic light emitting display panel, a plasma display panel, an electrophoretic display panel, a microelectromechanical system display panel, or an electrowetting display panel, for example.

In the exemplary embodiment of FIG. 2, the display panel DP may be a liquid crystal display panel, and in the exemplary embodiment of FIG. 3, the display panel DP may be an organic light emitting display panel. The display panel DP may further include a second substrate SUB2, in addition to the first substrate SUB1. The first and second substrates SUB1 and SUB2 may be provided to be spaced apart from each other and to face each other. The first substrate SUB1 may be adjacent to the adhesive part AP, and the second substrate SUB2 may be disposed to face the first substrate SUB1. The first and second substrates SUB1 and SUB2 may be spaced apart from each other in their thickness direction, which is the first direction DR1.

The first substrate SUB1 may include a plurality of the optical patterns OP. The optical patterns OP may be provided on an edge of the first substrate SUB1. More specifically, the optical patterns OP may be provided on an edge of the bottom surface of the first substrate SUB1.

Referring to FIGS. 1 to 3, the adhesive part AP may be provided on the display panel DP. The adhesive part AP may fixedly connect the display panel DP to the window part WP. The adhesive part AP may be an optically-transparent adhesive layer.

In the case where the adhesive part AP is the optically-transparent adhesive layer, the adhesive part AP may be provided in the form of optical clear adhesive ("OCA") or optical clear resin ("OCR"), for example. In the case where the OCA is provided, the optically-transparent adhesive layer may be provided in the form of a double-sided tape, for example. In an exemplary embodiment, the OCA provided in the form of the double-sided tape may contain a monomer or an oligomer, a part of which is uncured when the optically-transparent adhesive layer including the monomer or the oligomer is disposed between the window part WP and the display panel DP for the first time in a manufacturing process. However, such an uncured monomer or oligomer may be cured by an ultraviolet curing process after the optically-transparent adhesive layer is disposed between the window part WP and the display panel DP for the first time in a manufacturing process, for example. In the case where the OCR is provided, the formation of the adhesive part AP may include providing a liquid adhesive resin between the display panel DP and the window part WP and then curing the liquid adhesive resin through a subsequent ultraviolet curing process.

In an exemplary embodiment, the adhesive part AP may consist of or include one of acrylic adhesives, silicone adhesives, or urethane adhesives, for example. In an exemplary embodiment, the adhesive part AP may be formed by thermally or optically curing an adhesive resin, for example.

In an exemplary embodiment, for example, an adhesive resin of the adhesive part AP may contain an uncured cross-linking agent. The adhesive resin may include a material which can be later cured by ultraviolet light. In an exemplary embodiment, for example, the adhesive resin may include an uncured oligomer or monomer. The uncured oligomer or monomer may include a cross-linking agent. An unreacted cross-linking agent may cause a subsequent cross-linking reaction and thereby contribute to increase a degree of cross-linking of the adhesive resin. In an exemplary embodiment, the cross-linking agent may be a thermally- or optically-curable reactive substance, for example. Also, the adhesive resin may contain an initiator. In an exemplary embodiment, the initiator may be a thermal initiator or a photo initiator, for example. The initiator may be used to cause an additional polymerization of the monomer or oligomer.

Although, in the perspective view of FIG. 1, the adhesive part AP is illustrated to be separated from the display panel DP and the window part WP, the adhesive part AP of the display device DD may be fixedly connected to the window part WP and the display panel DP. That is, in the display device DD, the window part WP and the display panel DP may be disposed on top and bottom surfaces, respectively, of the adhesive part AP and may be fixedly coupled to each other through the adhesive part AP.

In FIG. 1, the adhesive part AP is illustrated to have a hexahedral shape. However, the inventive concept may not be limited thereto. In an exemplary embodiment, for example, since the liquid adhesive resin is provided between surfaces of the display panel DP and the window part WP, which are facing each other, the adhesive part AP, which is provided by curing the adhesive resin, may have various shapes depending on that of the surfaces of the display panel DP or the window part WP. In an exemplary embodiment, if the display panel DP and the window part WP have a curved or rounded shape in their surfaces facing each other, the adhesive part AP may have a shape, which corresponds to the shape of the surfaces of the display panel DP and the window part WP, and a side surface which is curved, not flat. In an exemplary embodiment, the adhesive part AP may include a protruding portion that is positioned out of at least one of the display panel DP and the window part WP. In an exemplary embodiment, the adhesive part AP may have a width in the second or third direction DR2 or DR3, which increases gradually as moves in a direction from its bottom surface adjacent to the display panel DP to its top surface adjacent to the window part WP. In some exemplary embodiments, the side surface of the adhesive part AP may have an irregular shape.

The window part WP may be disposed on the display panel DP. The window part WP may include a light-blocking region provided on or along its edge. The window part WP may include a base substrate BS and a light blocking layer BM on the base substrate BS. In some exemplary embodiments, the light blocking layer BM may be provided in the light-blocking region of the window part WP. The window part WP may be provided to cover a top surface of the display panel DP and thereby to protect the display panel DP. For example, when the display device DD is viewed in a plan view from outside to the window part WP, the window part WP may have an area that is larger than that of the top surface of the display panel DP opposite thereto.

The base substrate BS of the window part WP may include a glass. In an exemplary embodiment, for example, a tempered glass substrate may be used as the base substrate BS. In certain exemplary embodiments, the base substrate BS may include a flexible plastic material. In an exemplary embodiment, for example, the plastic material for the base substrate BS may include polyimide, polyacrylate, polymethylmethacrylate (PMMA), polycarbonate (PC), polyethylenenaphthalate (PEN), polyvinylidene chloride, polyvinylidene difluoride (PVDF), polystyrene, ethylene vinylalcohol copolymer, or combinations thereof. However, the inventive concept is not limited thereto and may be realized using any of materials or elements that is known as the base substrate BS of the window part WP.

The light blocking layer BM may be provided on an edge region of the base substrate BS. In particular, the light blocking layer BM may be provided on an edge region of a surface of the base substrate BS, facing the display panel DP. In other words, the light blocking layer BM may be provided on a circumferential region of the bottom surface of the base substrate BS. The light blocking layer BM may be a black print layer or a white print layer. However, the inventive concept is not limited thereto. The light blocking layer BM may be provided on the circumferential region of the base substrate BS and may be used to prevent a light leakage from occurring at the edge region of the display panel DP.

The window part WP may further include a functional layer (not shown) provided on the base substrate BS. In an exemplary embodiment, for example, the functional layer (not shown) may be a hard coating layer or an anti-fingerprint coating layer. However, the inventive concept is not limited thereto.

Although not shown in FIG. 1, the display device DD may further include a housing (not shown) which contains the display panel DP therein. For example, the display panel DP may be disposed in the housing, and the window part WP may be provided on the housing to cover the top surface of the display panel DP. In certain exemplary embodiments, the housing may contain both of the display panel DP and the window part WP therein.

Referring to FIG. 2, the display panel DP may be a liquid crystal display panel including a liquid crystal layer LCL provided between the first and second substrates SUB1 and SUB2. The first substrate SUB1 of the display panel DP may include a color filter layer, and the second substrate SUB2 may include a thin-film transistor ("TFT"). In certain exemplary embodiments, the first substrate SUB1 may include the thin-film transistor, and the second substrate SUB2 may include the color filter layer. In certain exemplary embodiments, one of the first and second substrates SUB1 and SUB2 may be configured to include both of the thin-film transistor and the color filter layer.

Although not shown, the display panel DP may include a polarizer (not shown) which is provided on each of the first and second substrates SUB1 and SUB2. In an exemplary embodiment, a first polarizer (not shown) may be provided on the top surface of the first substrate SUB1, and a second polarizer (not shown) may be provided on the bottom surface of the second substrate SUB2. However, the inventive concept is not limited thereto, and an in-cell type polarizer (not shown) may be provided in a liquid crystal display panel. In another exemplary embodiment, for example, a polarizer (not shown) may be provided on each of the bottom surface of the first substrate SUB1 and the top surface of the second substrate SUB2. Furthermore, a backlight unit (not shown) may be provided below the liquid crystal display panel and may be used to provide light to the display panel DP.

A sealing layer SL may be provided along a circumference of the liquid crystal layer LCL. The sealing layer SL may be provided between the first and second substrates SUB1 and SUB2 and may bond the first and second substrates SUB1 and SUB2 to each other. The sealing layer SL provided between the first and second substrates SUB1 and SUB2 may hermetically seal a space between the first and second substrates SUB1 and SUB2.

In an exemplary embodiment, the liquid crystal display panel may be operated in one of a vertical alignment ("VA") mode, a patterned vertical alignment ("PVA") mode, an in-plane switching ("IPS") mode, a fringe-field switching ("FFS") mode, and a plane-to-line switching ("PLS") mode, for example. However, the inventive concept is not limited to a display panel that is operated in a specific operation mode.

In the display device DD of FIG. 3, the display panel DP may be an organic light emitting display panel, and the first substrate SUB1 of the display panel DP may be an encapsulation substrate and the second substrate SUB2 may be a base element. In this case, a device layer OEL may be provided between the first substrate SUB1 and the second substrate SUB2. The device layer OEL may be provided on the second substrate SUB2 which serves as the base element, and the first substrate SUB1 which serves as the encapsulation substrate may be provided on the device layer OEL. In certain exemplary embodiments, the encapsulation substrate may be provided to surround the device layer OEL.

Although not shown, the display panel DP may further include an optical component (not shown), which is provided on the first substrate SUB1 which serves as the encapsulation substrate. In an exemplary embodiment, the optical component (not shown) may be a phase retardation plate or a polarizing plate, for example.

In an exemplary embodiment, the base element may be a glass substrate or a plastic substrate, for example. In an exemplary embodiment, for example, the plastic substrate for the base element may consist of or include at least one of polyimide (PI), polyethyleneterephthalate (PET), polyethylenenaphthalate (PEN), polyethersulphone (PES), or fiber reinforced plastics ("FRP"). In an exemplary embodiment, at least one inorganic layer may be provided on the base element. In an exemplary embodiment, for example, a silicon nitride layer or a silicon oxide layer may be provided on the base element.

The device layer OEL may include display elements. The display elements may be organic light emitting diodes. However, the inventive concept is not limited thereto. The encapsulation substrate may be used to protect the device layer OEL. The encapsulation substrate may be provided on the device layer OEL and may hermetically seal the device layer OEL. The encapsulation substrate may be spaced apart from the base element with respect to the device layer OEL interposed therebetween. A sealing element SEL may be provided along circumferences of the encapsulation substrate and the base element to define a space therebetween. In some exemplary embodiments, the encapsulation substrate may be provided in the form of a thin film. In another exemplary embodiment, the encapsulation substrate may be a glass substrate. However, the inventive concept is not limited thereto. In still another exemplary embodiment, for example, the encapsulation substrate may be a plastic substrate.

The display device DD shown in FIG. 3 may further include a touch sensing unit TSU. In an exemplary embodiment, although not shown in FIG. 2, the display device DD of FIG. 2 may include the touch sensing unit TSU provided between the display panel DP and the adhesive part AP. In another exemplary embodiment, touch sensing unit TSU may be provided on the top surface of the window part WP.

In still another exemplary embodiment, the touch sensing unit TSU may be provided between the display panel DP and the window part WP. An adhesive layer (not shown) may be provided between the touch sensing unit TSU and the display panel DP, and the adhesive layer may bond the touch sensing unit TSU and the display panel DP to each other. In some exemplary embodiments, the touch sensing unit TSU may be provided as a part of the display panel DP e.g., on the encapsulation substrate or the first substrate SUB1, without an additional adhesive layer.

The touch sensing unit TSU may include sensing electrodes and an interconnection line connected to the sensing electrodes. The touch sensing unit TSU may detect a direct or indirect touch event, which is produced by a user or an object. Here, the indirect touch event means that, even if the touch sensing unit TSU is not touched by a user or an object, the touch sensing unit TSU can sense an event that a distance between the touch sensing unit TSU and the user or object is less than a critical distance for recognizing the event.

In the case where the direct or indirect touch event occurs, there may be a change in electrostatic capacitance between different sensing electrodes. In this case, the touch sensing unit TSU may obtain coordinates of the touch event by sensing signals of the sensing electrodes or delay times thereof. As described in the above example, the touch sensing unit TSU may be operated in an electrostatic capacitance manner. However, the inventive concept is not limited thereto. In an exemplary embodiment, for example, the touch sensing unit TSU may be operated in a resistive touch sensing manner. In an alternative exemplary embodiment, the touch sensing unit TSU may be operated in a self- or mutual-capacitance manner.

In the exemplary embodiments shown in FIGS. 1 to 3, the formation of the display device DD may include a process of bonding the window part WP to the display panel DP using the adhesive part AP interposed therebetween. In an exemplary embodiment, for example, the process of bonding the window part WP to the display panel DP may include supplying a liquid adhesive resin, which will be used as the adhesive part AP, on the bottom surface of the window part WP and then providing the display panel DP on the adhesive resin. Thereafter, pressure may be exerted to the window part WP and the display panel DP which are bonded with each other, and in this case, the adhesive resin may be spread to fill a gap between the display panel DP and the window part WP. In certain exemplary embodiments, ultraviolet light may be used to cure the adhesive part AP provided in the form of the liquid adhesive resin. The ultraviolet light may be provided, through the window part WP, on the adhesive part AP. The window part WP may be configured to permit transmission of the ultraviolet light, and thus, the ultraviolet light may be used to cure the liquid adhesive resin. In certain exemplary embodiments, a side surface of an exposed portion of the adhesive resin may also be cured by the ultraviolet light passing through a side surface of the display device DD. Furthermore, as described above, the optical patterns OP may be provided on the first substrate SUB1 of the display panel DP, and thus, the adhesive resin below the light blocking layer BM of the window part WP may be cured by the ultraviolet light transmitted through the optical patterns OP.

A plurality of the optical patterns OP may be provided on an edge region of the bottom surface of the first substrate SUB1. Referring to FIG. 2, the optical patterns OP may be disposed to overlap the light blocking layer BM of the window part WP in the first direction DR1. In other words, the optical patterns OP may be provided to be adjacent to the light-blocking region of the window part WP. In certain exemplary embodiments, the optical patterns OP may be disposed to overlap a portion of the adhesive part AP positioned below the light blocking layer BM in the first direction DR1. In other words, the optical patterns OP may be disposed in a region which overlaps the light-blocking region and the portion of the adhesive part AP positioned below the light-blocking region.

In some exemplary embodiments, the optical patterns OP may be provided to be adjacent to the non-display area NDA of the display panel DP. In an exemplary embodiment, for example, the optical patterns OP may overlap the non-display area NDA of the display panel DP, when viewed in a plan view in a direction opposite to the first direction DR1.

Referring to FIG. 2, the non-display area NDA may include a first non-display area NDA1 which overlaps the adhesive part AP, and a second non-display area NDA2 which does not overlap the adhesive part AP. The optical patterns OP may be disposed in the first non-display area NDA1.

In the exemplary embodiments of FIGS. 2 and 3, the optical patterns OP may be recess patterns that are defined in the bottom surface of the first substrate SUB1. In an exemplary embodiment, for example, the optical patterns OP may be recess patterns which are concavely defined in the bottom surface of the first substrate SUB1. Referring to FIGS. 2 and 3, the optical patterns OP may have a semi-circular or semi-elliptic section, as shown in a sectional view defined by first and second directions DR1 and DR2. But the inventive concept may not be limited thereto.

Figure 4A:
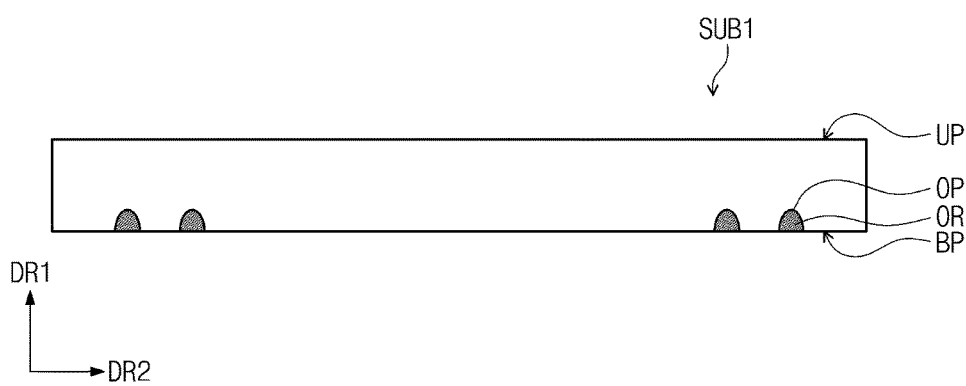
FIG. 4A is a sectional view illustrating an exemplary embodiment of a first substrate of the display panels of FIGS. 2 and 3.
Figure 4B:
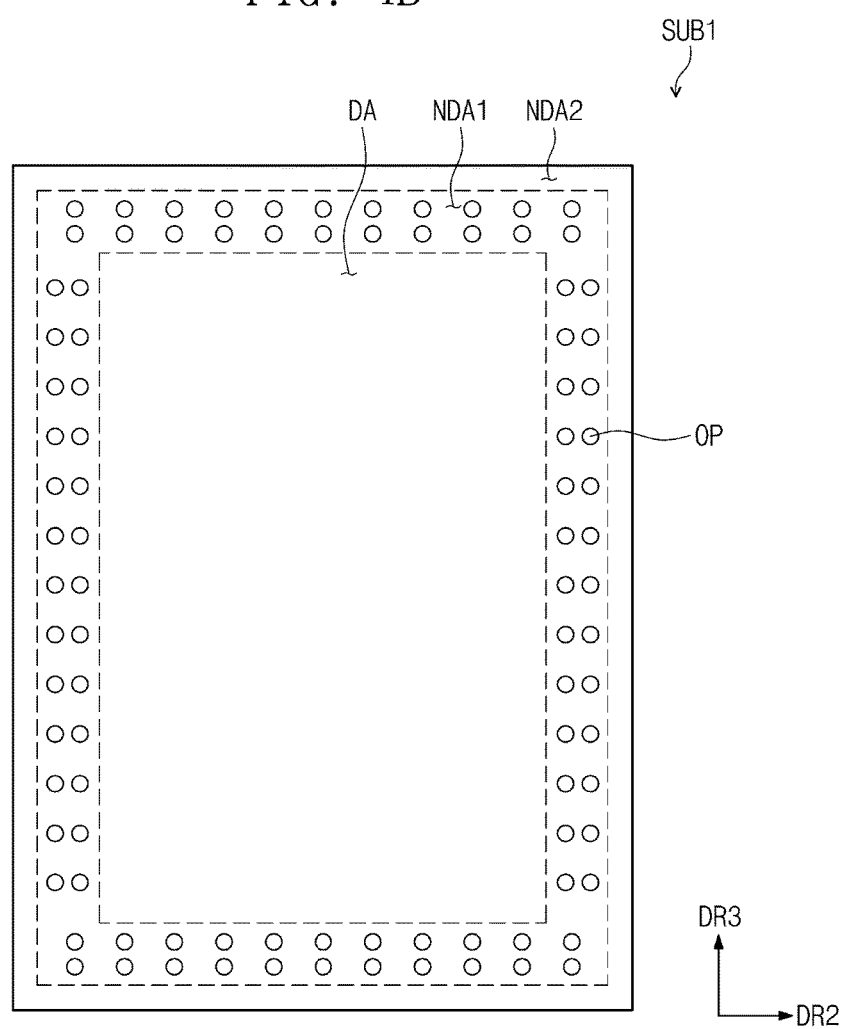
FIG. 4B is a plan view illustrating an exemplary embodiment of a bottom surface of the first substrate of FIG. 4A.

FIGS. 4A and 4B are diagrams illustrating the first substrate SUB1 with a plurality of optical patterns OP. FIG. 4A is a sectional view of an exemplary embodiment of the first substrate SUB1 of the display panel DP of FIGS. 2 and 3, and FIG. 4B is a plan view illustrating an exemplary embodiment of a bottom surface BP of the first substrate SUB1 of FIG. 4A.

Referring to FIG. 4A, the optical patterns OP may be recess patterns defined in the bottom surface of the first substrate SUB1. The recess patterns may be concave regions that recesses the bottom surface BP of the first substrate SUB1 toward a top surface UP. The recess patterns may be filled with a material different from that of the first substrate SUB1. In some exemplary embodiments, an optical resin OR may be provided to fill the recess patterns. The optical resin OR may consist of or include a material whose refractive index is different from that of the first substrate SUB1.

In some exemplary embodiments, the first substrate SUB1 may have a rectangular shape, and the optical patterns OP may be arranged along four sides of the first substrate SUB1 and within an edge region of the first substrate SUB1. However, the inventive concept is not limited thereto. In another exemplary embodiment, for example, the optical patterns OP may be arranged within a portion of the edge region of the first substrate SUB1.

The optical patterns OP may scatter light incident into the first substrate SUB1. Also, the optical patterns OP may change a propagation direction of the incident light. In an exemplary embodiment, for example, the optical patterns OP may allow the light, which is incident into the first substrate SUB1, to transmit to the top surface of the display panel DP or to propagate in the first direction DR1.

As shown in FIG. 4B, in a plan view illustrating a plane of the first substrate SUB1 defined by second and third directions DR2 and DR3, the optical patterns OP of the first substrate SUB1 may have a circular shape and may be arranged to be uniformly spaced apart from each other. However, the inventive concept may not be limited thereto. In another exemplary embodiment, the optical patterns OP may have an elliptical or polygonal shape and may be arranged in an irregular manner in the plan view.

Referring to FIG. 4B, the optical patterns OP may be provided within the non-display area NDA which is defined outside the display area DA of the first substrate SUB1. In some exemplary embodiments, the optical patterns OP may be provided within the first non-display area NDA1 of the non-display area NDA, which overlaps the adhesive part AP and the light blocking layer BM of FIG. 2.

The sectional view of FIG. 4A illustrates an example in which two optical patterns OP are provided near a side edge of the first substrate SUB1. However, the number of the optical patterns OP is not limited thereto. In another exemplary embodiment, three or more optical patterns OP may be provided near the side edge of the first substrate SUB1 in a sectional view. In certain exemplary embodiments, the number of the optical patterns OP may vary from position to position on the first substrate SUB1. In an exemplary embodiment, for example, the numbers of the optical patterns OP, which are respectively provided at opposite sides of the first substrate SUB1, may be different from each other.

In certain exemplary embodiments, the optical patterns OP may be provided in a dot-scattered manner on the bottom surface of the first substrate SUB1. In certain exemplary embodiments, the optical patterns OP may be provided in a stripe shape. In an exemplary embodiment, for example, in the case where the first substrate SUB1 has a rectangular shape, the optical patterns OP may be provided in a stripe shape parallel to one of four sides of the first substrate SUB1 in a plan view illustrating a plane of the first substrate SUB1, defined by the second and third directions DR2 and DR3.

Figure 5A:
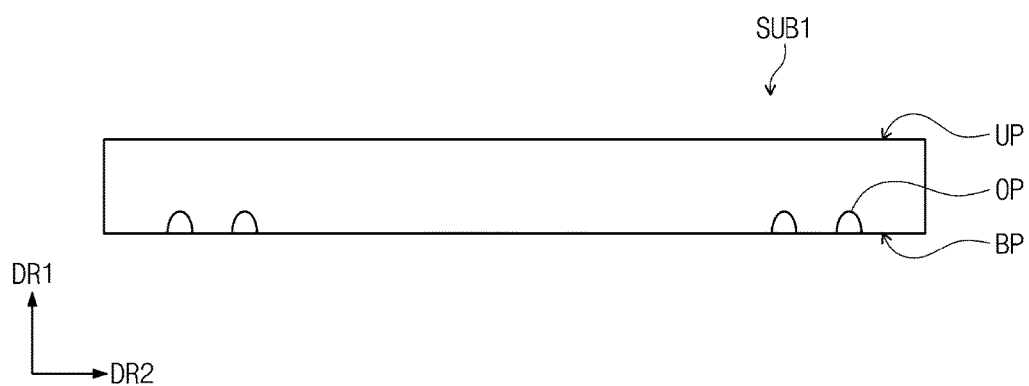
FIGS. 5A to 5C are sectional views illustrating exemplary embodiments of a first substrate of a display panel.
Figure 5B:
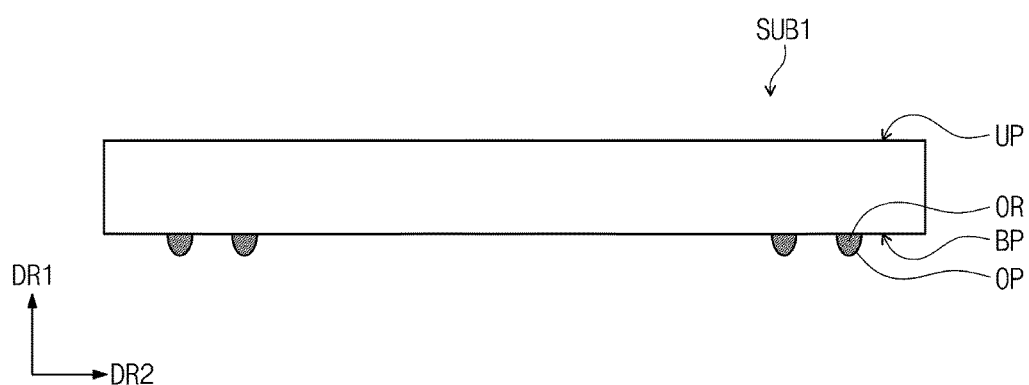
Figure 5C:
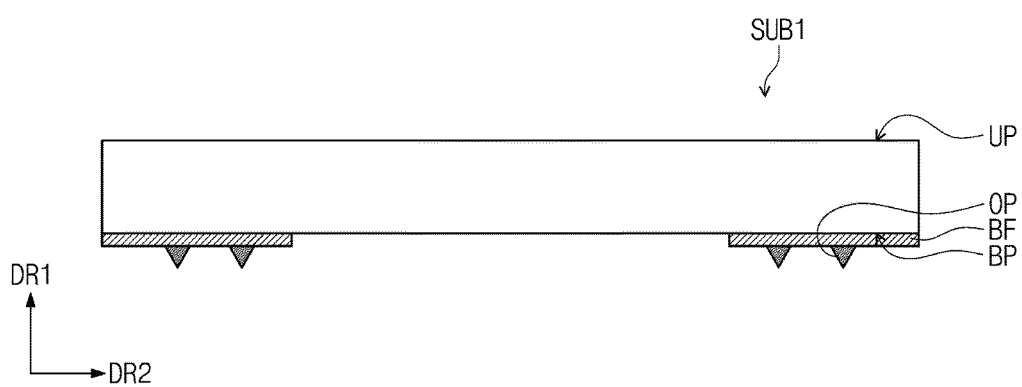

FIGS. 5A to 5C are diagrams illustrating some examples of the first substrate SUB1 with the optical patterns OP. In detail, FIGS. 5A to 5C are sectional views illustrating the first substrate SUB1.

FIG. 5A illustrates an exemplary embodiment in which the optical patterns OP of the first substrate SUB1 are provided in the form of a recess pattern. The recess patterns may be empty regions that are defined in the bottom surface of the first substrate SUB1.

Referring to FIG. 5B, each of the optical patterns OP may be provided to have a structure protruding from a surface of the first substrate SUB1. In an exemplary embodiment, for example, the optical patterns OP may be protruding patterns protruding from the bottom surface BP of the first substrate SUB1 toward the second substrate SUB2 shown in FIG. 2. In an exemplary embodiment, the optical patterns OP may be provided to have a semi-circular, semi-elliptical, or polygonal shape on a plane defined by the first and second directions DR1 and DR2 which is a plane normal to the bottom surface of the first substrate SUB1, for example.

The optical patterns OP may be provided to be in direct contact with the bottom surface BP of the first substrate SUB1. In some exemplary embodiments, the optical patterns OP and the first substrate SUB1 may be provided to form a single unitary indivisible body. In an exemplary embodiment, for example, the optical patterns OP may be provided in the same manufacturing process to provide the first substrate SUB1. In an exemplary embodiment, the optical patterns OP may consist of the same material as that of the first substrate SUB1.

In certain exemplary embodiments, the optical patterns OP may consist of a material different from that of the first substrate SUB1. The optical patterns OP may be provided on the first substrate SUB1 by an additional process. In an exemplary embodiment, for example, an adhesive layer (not shown) may be further provided between the optical patterns OP and the first substrate SUB1.

As shown in FIG. 5C, the first substrate SUB1 may include a base film BF provided on the bottom surface BP of the first substrate SUB1 and the optical patterns OP provided on the base film BF. In an exemplary embodiment, the optical patterns OP may be provided on the base film BF by an additional process, and then, the film-shaped structure, the base film BF, with the optical patterns OP may be provided on the bottom surface BP of the first substrate SUB1. In the case where the optical patterns OP are provided on the film-shaped structure, an adhesive layer (not shown) may be further provided between the base film BF and the bottom surface BP of the first substrate SUB1.

In the cross-section of the first substrate SUB1 defined by the first and second directions DR1 and DR2, the optical patterns OP may have a semi-circular section as shown in FIGS. 5A and 5B or a triangular section as shown in FIG. 5C. However, the inventive concept may not be limited thereto and the section of the optical patterns OP may be variously changed. For example, in the exemplary embodiments of FIGS. 5A and 5B, the optical patterns OP may have a triangular section, and in the exemplary embodiments of FIG. 5C, the optical patterns OP may have a semi-circular section, alternatively. Although not shown, the section of the optical patterns OP may be shaped like a portion of an ellipse or a polygon in the cross-section of the first substrate SUB1 defined by the first and second directions DR1 and DR2.

The optical patterns OP may have substantially the same size. In certain exemplary embodiments, the optical patterns OP may have different sizes.

In an exemplary embodiment, the optical patterns OP may consist of or include at least one of polyethylene terephthalate (PET), polymethyl methacrylate (PMMA), or polycarbonate (PC), for example. However, the material of the optical patterns OP is not limited to the above polymer material. The optical patterns OP may include the same material as that of the first substrate SUB1. In an exemplary embodiment, for example, the optical patterns OP and the first substrate SUB1 may include glass.

The optical patterns OP may include a material different from that of the first substrate SUB1, and in this case, the optical patterns OP may have a refractive index different from that of the first substrate SUB1.

In an exemplary embodiment, for example, the optical patterns OP may be filled with an optical resin whose refractive index is different from that of the first substrate SUB1, and in some exemplary embodiments, the optical resin may contain at least one of a $TiO_2$ particle or a $SiO_2$ particle, for example. The $TiO_2$ or $SiO_2$ particle may contribute to scatter or diffuse light. The optical patterns OP may further include a binder material, in addition to the $TiO_2$ or $SiO_2$ particle. The binder material may be a polymer resin, in which $TiO_2$ particles or $SiO_2$ particles are scattered. In an exemplary embodiment, the binder material may be at least one of acrylic resins or silicone resins, for example.

Figure 6:
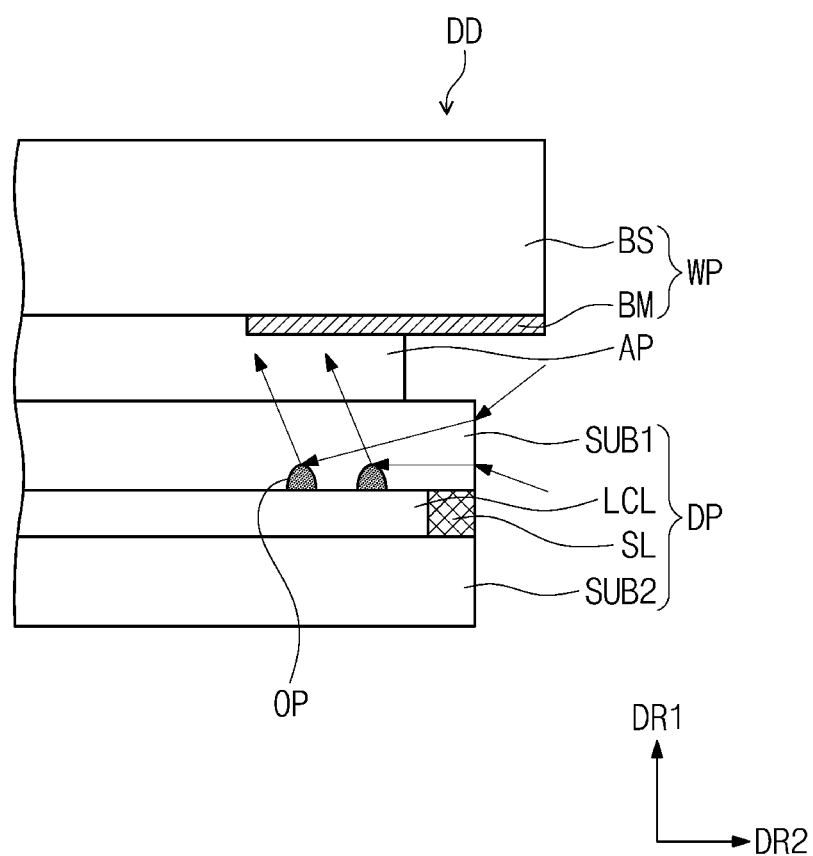
FIG. 6 is a diagram illustrating an exemplary embodiment of a portion of a display device with a path of ultraviolet light propagating in the display device.

FIG. 6 is a sectional view illustrating an exemplary embodiment of a portion of the display device DD. FIG. 6 illustrates schematically a propagation path of ultraviolet light that is incident through a side surface of the display device DD and cures the adhesive part AP in an edge portion. The propagation path of the ultraviolet light is depicted by arrows. In the case where ultraviolet light is incident through the side surface of the first substrate SUB1, a fraction of the ultraviolet light may be incident into the optical patterns OP provided on the bottom surface of the first substrate SUB1, may be scattered and refracted by the optical patterns OP, and may be incident into the adhesive part AP. The ultraviolet light scattered by the optical patterns OP may be incident into a portion of the adhesive part AP, which overlaps the light blocking layer BM of the window part WP.

In the display device according to some exemplary embodiments of the invention, optical patterns may be provided in an edge region of a first substrate of a display panel. The optical patterns may allow a fraction of ultraviolet light, which is incident in the first substrate of the display panel, to propagate toward an adhesive part. The optical patterns may also be used to scatter the ultraviolet light, which is incident into the first substrate, or to change a propagation direction of the ultraviolet light toward the adhesive part. Accordingly, it is possible to increase an amount of the ultraviolet light propagating toward the adhesive part. As a result, it is possible to increase a degree of cure of the adhesive part provided below a light blocking layer and to improve an adhesion property of the adhesive part provided between a window part and the display panel.

Figure 7:
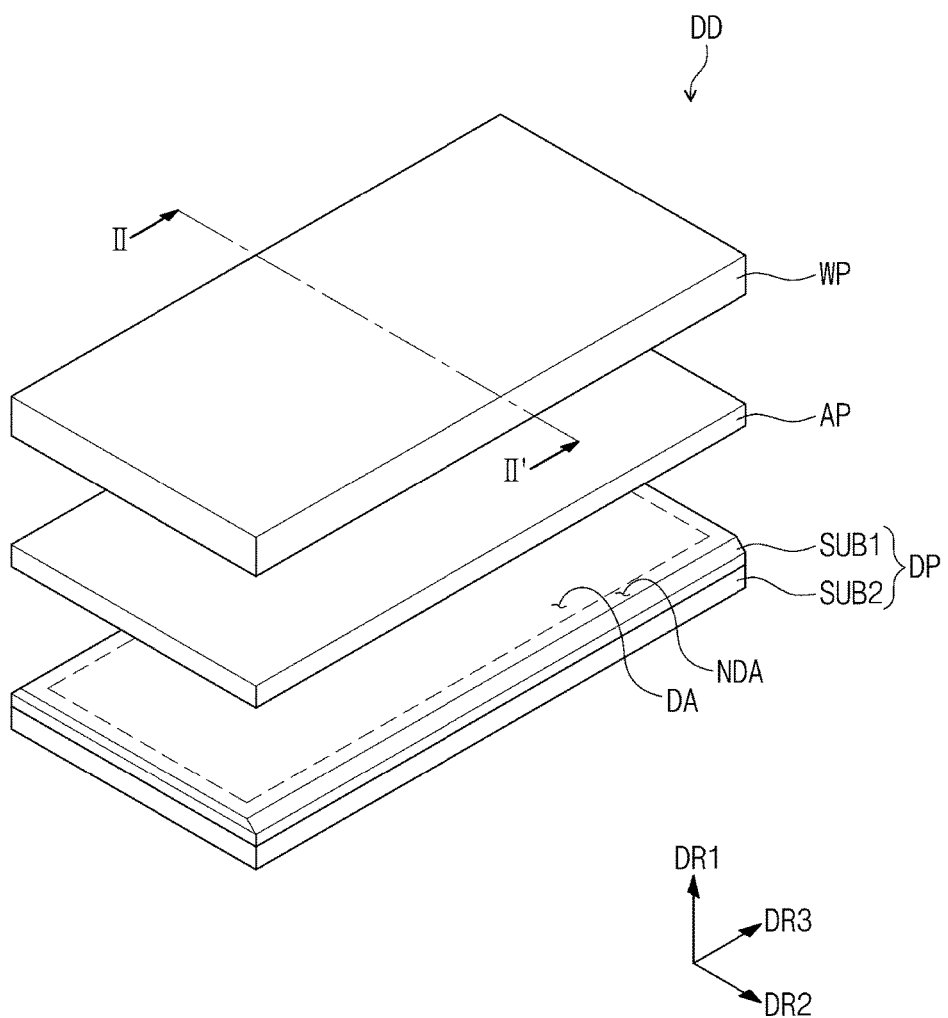
FIG. 7 is an exploded perspective view of another exemplary embodiment of a display device.
Figure 8:
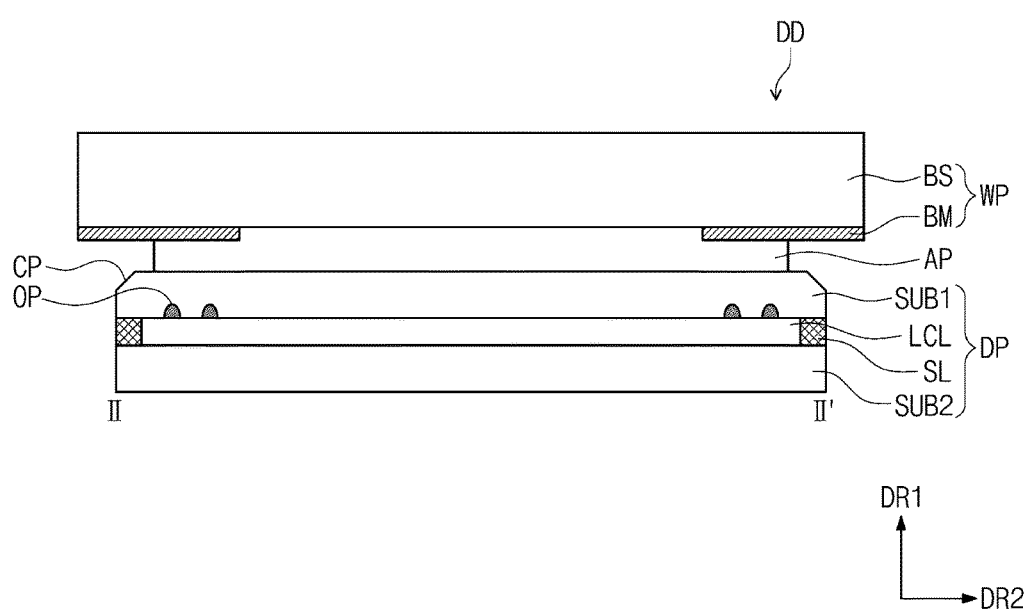
FIG. 8 is a cross-sectional view of another exemplary embodiment of a display device, taken along line II-IP of FIG. 7.
Figure 9A:
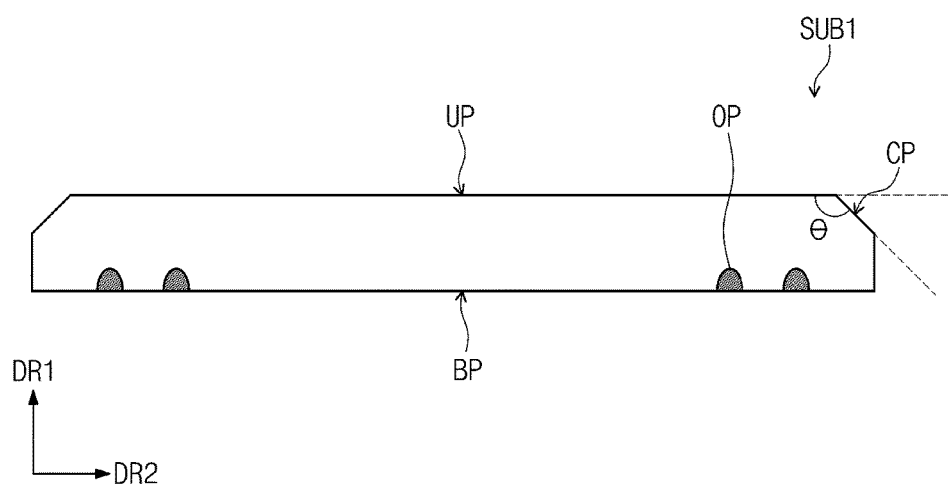
FIGS. 9A to 9C are sectional views illustrating exemplary embodiments of a first substrate of a display panel provided in the display device of FIG. 8.
Figure 9B:
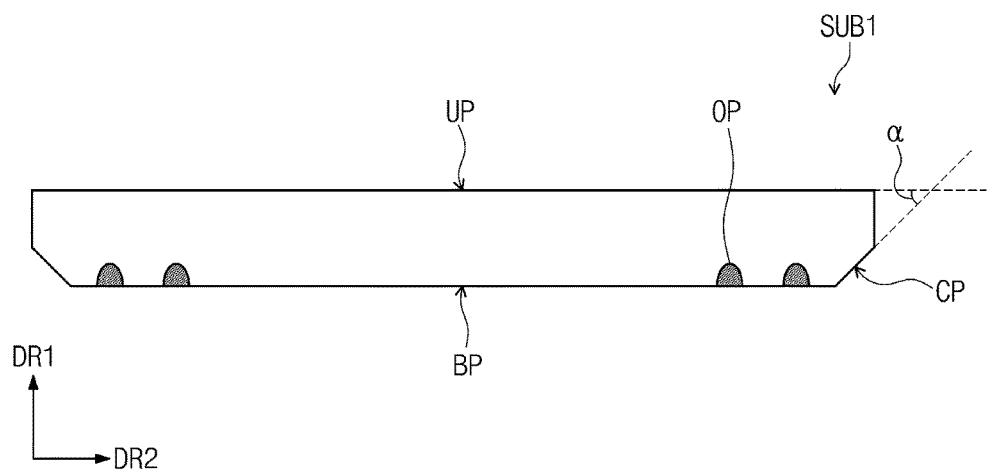
Figure 9C:
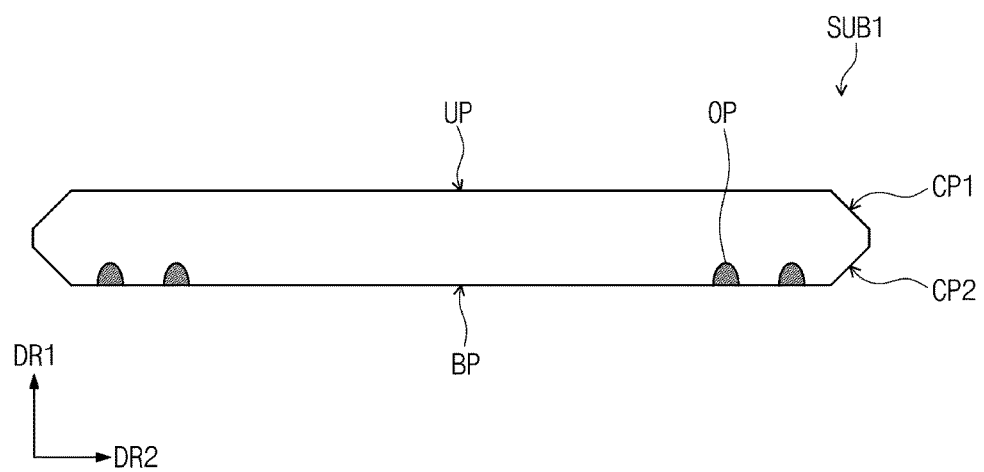
Figure 10:
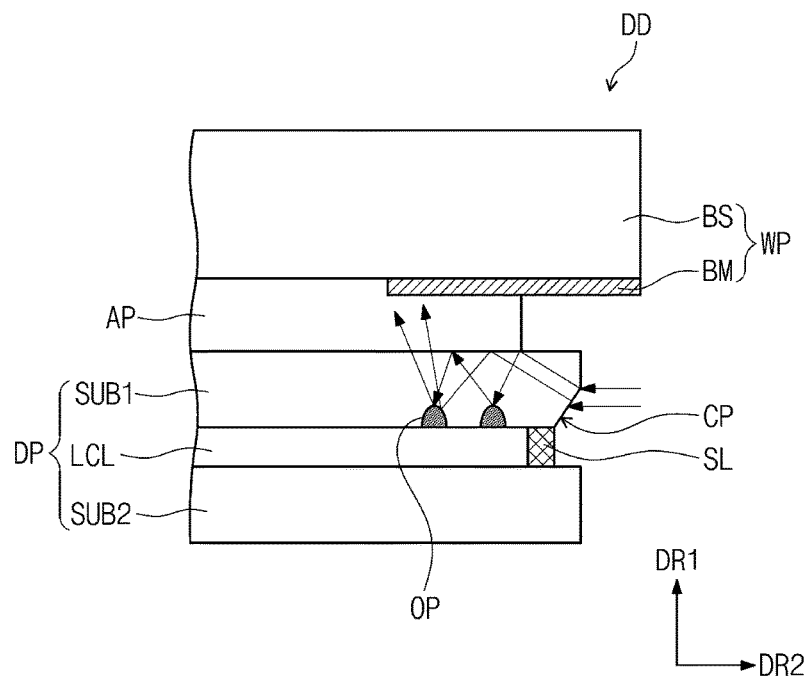
FIG. 10 is a diagram illustrating an exemplary embodiment of a portion of a display device with a path of ultraviolet light propagating in the display device.

FIG. 7 is an exploded perspective view of another exemplary embodiment of the display device DD, and FIG. 8 is a cross-sectional view of an exemplary embodiment of the display device DD, taken along line II-IP of FIG. 7. FIGS. 9A to 9C are sectional views illustrating exemplary embodiments of the first substrate SUB1 in the display device DD of FIG. 8. FIG. 10 is a sectional view of an exemplary embodiment of a portion of a display device with a path of ultraviolet light propagating in the display device. In the following description of the display device DD and the first substrate SUB1 shown in FIGS. 7 to 10, elements previously described with reference to FIGS. 1 to 6 will be identified by a similar or identical reference number without repeating an overlapping description thereof.

In some exemplary embodiments, the display device DD may include the display panel DP, the adhesive part AP provided on the display panel DP, the window part WP provided on the adhesive part AP, and a plurality of the optical patterns OP provided on the edge of the bottom surface of the first substrate SUB1. The adhesive part AP may be provided between the display panel DP and the window part WP and may be used to connect the display panel DP and the window part WP to each other.

In some exemplary embodiments, the window part WP may include a light-blocking region at its edge region. The window part WP may include the base substrate BS and the light blocking layer BM, and here, the light-blocking region may be a region corresponding to the light blocking layer BM. The display panel DP may include the first and second substrates SUB1 and SUB2 which are facing each other. The display panel DP of FIG. 8 may be a liquid crystal display panel. The display panel DP may include the liquid crystal layer LCL interposed between the first and second substrates SUB1 and SUB2. However, display panels according to some exemplary embodiments of the invention are not limited to the liquid crystal display panel. In an exemplary embodiment, for example, the display panel DP may be an organic light emitting display panel. In the case of the organic light emitting display panel, the first substrate SUB1 may be an encapsulation substrate and the second substrate SUB2 may be a base element with an organic light emitting device.

The first substrate SUB1 may include an inclined surface CP that is provided at a corner thereof. The inclined surface CP may be provided at an upper or lower corner of the first substrate SUB1. In an exemplary embodiment, for example, the first substrate SUB1 may include at least one of first and second inclined surfaces which are respectively defined at the upper and lower corners thereof. The inclined surface CP may be a surface that is defined by chamfering the corner of the first substrate SUB1.

FIG. 9A is a sectional view illustrating an exemplary embodiment of the first substrate SUB1 of the display device DD of FIGS. 7 and 8. FIGS. 9B and 9C are sectional views illustrating other exemplary embodiments of the first substrate SUB1.

FIG. 9A illustrates an example in which the inclined surface CP is defined near the corner of the top surface UP of the first substrate SUB1. Referring to FIG. 9A, the inclined surface CP may be inclined at an angle $\theta$ relative to the plane of the top surface UP of the first substrate SUB1. In the case where, as shown in FIG. 9A, the inclined surface CP is defined near the corner of the top surface UP, an angle $\theta$ of the inclined surface CP may be an obtuse angle. In an exemplary embodiment, for example, the angle $\theta$ may range from about 100 degrees to about 170 degrees. In some exemplary embodiments, the angle $\theta$ may range from about 120 degrees to about 150 degrees, in particular about 135 degrees.

If the angle $\theta$ is within a range of 90-100 degrees or of 170-180 degrees, the inclined surface CP may refract ultraviolet light at a small angle, and in this case, it may be difficult to increase an amount of the ultraviolet light propagating toward the bottom surface BP of the first substrate SUB1 in comparison to the case where there is no inclined surface CP. Furthermore, in this case, the ultraviolet light which is refracted by the inclined surface CP and propagates toward the bottom surface BP of the first substrate SUB1, may be totally reflected in the first substrate SUB1, and this may lead to a reduction in an amount of light to be incident into the adhesive part AP.

FIG. 9B illustrates an example in which the inclined surface CP is defined near the corner of the bottom surface BP of the first substrate SUB1. Referring to FIG. 9B, the inclined surface CP may be inclined at an angle $\alpha$ relative to the plane of the top surface UP of the first substrate SUB1. In the case where, as shown in FIG. 9B, the inclined surface CP is defined near the corner of the bottom surface BP, an angle $\alpha$ of the inclined surface CP may be an acute angle. In an exemplary embodiment, for example, the angle $\alpha$ may range from about 10 degrees to about 80 degrees. In some exemplary embodiments, the angle $\alpha$ may range from about 30 degrees to about 60 degrees, in particular about 45 degrees.

If the angle $\alpha$ is within a range of 0-10 degrees or of 80-90 degrees, the inclined surface CP may refract ultraviolet light at a small angle, and in this case, it may be difficult to increase an amount of the ultraviolet light propagating toward the bottom surface BP of the first substrate SUB1 in comparison to the case where there is no inclined surface CP. Furthermore, in this case, the ultraviolet light which is refracted by the inclined surface CP and propagates toward the bottom surface BP of the first substrate SUB1, may be totally reflected in the first substrate SUB1, and this may lead to a reduction in an amount of light to be incident into the adhesive part AP.

FIG. 9C illustrates an example in which the inclined surfaces CP1 and CP2 are defined near the corners of both of the top and bottom surfaces UP and BP of the first substrate SUB1. The first substrate SUB1 may include a first inclined surface CP1, which is defined near the corner of the top surface UP, and a second inclined surface CP2, which is defined near the corner of the bottom surface BP. The first inclined surface CP1 may have an obtuse angle relative to the plane of the top surface UP of the first substrate SUB1, similar to the inclined surface CP shown in FIG. 9A. In an exemplary embodiment, for example, the first inclined surface CP1 may be inclined at an angle of about 120 degrees to about 150 degrees, relative to the plane of the top surface UP of the first substrate SUB1.

The second inclined surface CP2 may have an acute angle relative to the plane of the top surface UP of the first substrate SUB1, similar to the inclined surface CP shown in FIG. 9B. In an exemplary embodiment, for example, the second inclined surface CP2 may be inclined at an angle of about 30 degrees to about 60 degrees, relative to the plane of the top surface UP of the first substrate SUB1. In some exemplary embodiments, the first and second inclined surfaces CP1 and CP2 may be symmetric to each other with respect to the top or bottom surface UP or BP of the first substrate SUB1. However, the inventive concept may not be limited thereto. In another exemplary embodiment, for example, the first and second inclined surfaces CP1 and CP2 may have no symmetry with respect to the top or bottom surface UP or BP of the first substrate SUB1.

In the examples shown in FIGS. 9A to 9C, the inclined surfaces CP, CP1, and CP2 of the first substrate SUB1 may change a propagation direction of ultraviolet light, which is incident through the side surface of the first substrate SUB1, and thereby to easily provide the ultraviolet light into the bottom surface BP of the first substrate SUB1.

FIG. 10 is a sectional view illustrating an exemplary embodiment of a portion of the display device DD with a path of ultraviolet light propagating in the display device DD. The display device DD of FIG. 10 may include the display panel DP, the window part WP on the display panel DP, and the adhesive part AP between the display panel DP and the window part WP.

The display panel DP may be a liquid crystal display panel. The display panel DP may include the first substrate SUB1 which is provided adjacent to the adhesive part AP, and the second substrate SUB2 which is provided to face the first substrate SUB1. The display panel DP may include the liquid crystal layer LCL provided between the first and second substrates SUB1 and SUB2. The sealing layer SL may be provided along a circumference of the liquid crystal layer LCL. The sealing layer SL may be provided between the first and second substrates SUB1 and SUB2 and may bond the first and second substrates SUB1 and SUB2 to each other. The sealing layer SL provided between the first and second substrates SUB1 and SUB2 may also hermetically seal a space between the first and second substrates SUB1 and SUB2.

FIG. 10 illustrates schematically a propagation path of ultraviolet light that is incident through the side surface of the display device DD. The propagation path of the ultraviolet light is depicted by arrows. In FIG. 10, the first substrate SUB1 of the display panel DP may include the inclined surface CP which is defined near the corner of the bottom surface. The ultraviolet light incident through a side surface of the first substrate SUB1 may be refracted by the inclined surface CP, and the ultraviolet light may propagate toward the top surface of the first substrate SUB1. Thereafter, the ultraviolet light may be totally reflected by the top surface of the first substrate SUB1, and then may be incident into the optical patterns OP which are provided on the bottom surface of the first substrate SUB1, and then may be scattered by the optical patterns OP. A fraction of the ultraviolet light scattered by the optical patterns OP may be incident into the adhesive part AP provided below the light blocking layer BM. Accordingly, in the case where the first substrate SUB1 has the bottom surface provided with the optical patterns OP and the inclined surface CP at the corner thereof, the optical patterns OP and the inclined surface CP may refract and scatter ultraviolet light incident through the side surface of the first substrate SUB1, and this may make it possible to increase an amount of ultraviolet light propagating toward the adhesive part AP provided below the light blocking layer BM.

Figure 11:
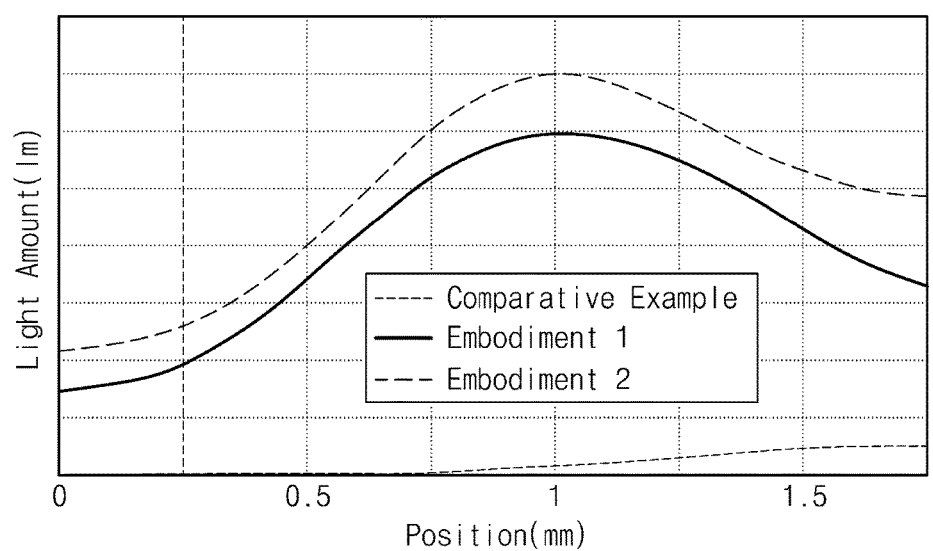
FIG. 11 is a graph illustrating light amount of ultraviolet light (lumen: lm) versus measured position in the adhesive part AP (millimeters: mm) according to a comparative example and example embodiments.

FIG. 11 is a graph illustrating light amount ultraviolet light (lumen: lm) versus measured position in the adhesive part AP (millimeters: mm) according to a comparative example and exemplary embodiments. FIG. 11 shows a result of a simulation that is performed to obtain an amount of ultraviolet light incident into an adhesive part of a display device according to a comparative example and exemplary embodiments. In FIG. 11, the curve depicted by the legend "comparative example" was obtained from a conventional display device, in which an optical pattern on a first substrate and an inclined surface are not provided. The curve depicted by the legend "Embodiment 1" was obtained from a display device, in which an inclined surface is defined at a corner of a first substrate serving as an upper substrate of a display panel. The curve depicted by the legend "Embodiment 2" was obtained from a display device, in which an inclined surface is defined at a corner of a first substrate of a display panel and optical patterns are provided on a bottom surface of the first substrate. In the embodiments 1 and 2, the inclined surface is provided at the corner of the bottom surface of the first substrate. The inclined surface was inclined at an angle of 45 degrees relative to a plane of a top surface of the first substrate.

In the graph of FIG. 11, an x axis represents a distance of a point from an interface between the adhesive part and the first substrate in a thickness direction of the adhesive part. That is, the larger an x value of a point, the closer the point is to the window part. A point whose x value is "1 mm" is located at a middle level of the adhesive part in the thickness direction.

FIG. 11 shows that an amount of ultraviolet light incident into the middle point of the adhesive part is higher in the embodiments 1 and 2 than in the comparative example. Furthermore, the amount of ultraviolet light incident into each point of the adhesive part is higher in the embodiment 2, in which both the optical patterns and the inclined surface are provided, than in the embodiment 1, in which only the inclined surface is provided. That is, in the case where optical patterns are provided on an upper substrate of a display panel and an inclined surface is defined at a corner of the upper substrate, it is possible to increase an amount of light incident into an adhesive part provided below a light blocking layer of a window part. Thus, in the display devices according to the embodiments 1 and 2, it is possible to improve a curing property of the adhesive part provided below the light blocking layer and to improve an adhesion property between the window part and the display panel, compared with the comparative example.

According to some exemplary embodiments of the invention, a display device may include optical patterns, which are provided on an edge region of an upper substrate of a display panel. The optical patterns may be configured in such a way that ultraviolet light incident through a side surface of the display device is easily incident into an adhesive part provided below a light blocking layer of a window part. Accordingly, it is possible to increase an amount of the ultraviolet light incident into the adhesive part, to improve a curing property of the adhesive part, and to improve an adhesion property between the window part and the display panel.

According to some exemplary embodiments of the invention, the display device may further include an inclined surface, which is defined at a corner of the upper substrate of the display panel. The inclined surface may be configured in such a way that the ultraviolet light incident through the side surface of the display device is easily incident into the adhesive part provided below the light blocking layer of the window part. Accordingly, it is possible to increase an amount of the ultraviolet light incident into the adhesive part, to improve a curing property of the adhesive part, and to improve an adhesion property between the window part and the display panel.

According to some exemplary embodiments of the invention, a display device may include optical patterns provided below an upper substrate of a display panel. Light scattered by the optical patterns may propagate toward an adhesive part and contribute to improve an adhesion property of an adhesive part provided below a light blocking layer of a window part.

According to some exemplary embodiments of the invention, a display device may include optical patterns provided below an upper substrate of a display panel and an inclined surface defined at a corner of the upper substrate. Accordingly, it is possible to increase an amount of ultraviolet light to be incident into an adhesive part provided below a light blocking layer of a window part and thereby to improve an adhesion property of the adhesive part.

While example exemplary embodiments of the invention have been particularly shown and described, it will be understood by one of ordinary skill in the art that variations in form and detail may be made therein without departing from the spirit and scope of the attached claims.

What is claimed is:

1. A display device, comprising:
a display panel comprising first and second substrates which face each other;
a window part disposed on the display panel and which comprises a light-blocking region disposed at an edge region thereof;
an adhesive part disposed between the display panel and the window part; and
a plurality of optical patterns disposed on an edge region of a bottom surface of the first substrate,
wherein the optical patterns are recess patterns which are defined in the bottom surface of the substrate or protruding patterns which protrude from the bottom surface of the first substrate.

2. The display device of claim 1, wherein the optical patterns are disposed on a region corresponding to the light-blocking region.

3. The display device of claim 2, wherein the optical patterns are disposed to overlap the adhesive part along a thickness direction of the adhesive part.

4. The display device of claim 1, wherein the display panel comprises a display area and a non-display area adjacent to the display area, and
the optical patterns are disposed on a region corresponding to the non-display area.

5. The display device of claim 1, wherein the recess patterns are filled with an optical resin whose refractive index is different from that of the first substrate.

6. The display device of claim 5, wherein the optical resin further comprises at least one of a $TiO_2$ particle or a $SiO_2$ particle.

7. The display device of claim 1, wherein the protruding patterns and the first substrate are a single body.

8. The display device of claim 1, wherein the protruding patterns comprises an optical resin whose refractive index is different from that of the first substrate.

9. The display device of claim 8, wherein the optical resin further comprises at least one of a $TiO_2$ particle or a $SiO_2$ particle.

10. The display device of claim 1, further comprising a touch sensing unit provided between the display panel and the adhesive part.

11. The display device of claim 1, wherein the display panel comprises a liquid crystal display panel including a liquid crystal layer disposed between the first and second substrates.

12. The display device of claim 1, wherein the display panel is an organic light emitting display panel, and
the first substrate is an encapsulation substrate.

13. A display device, comprising:
a display panel comprising first and second substrates which face each other;
a window part disposed on the display panel and which comprises a light-blocking region disposed at an edge region thereof;
an adhesive part disposed between the display panel and the window part; and a plurality of optical patterns disposed on an edge region of a bottom surface of the first substrate,
wherein each of the optical patterns has at least one of semi-circular, semi-elliptical, or polygonal shapes, on a plane normal to the bottom surface of the first substrate.

14. The display device of claim 13, wherein the optical patterns are disposed on a region corresponding to the light-blocking region.

15. The display device of claim 13, wherein the display panel comprises a display area and a non-display area adjacent to the display area, and
the optical patterns are disposed on a region corresponding to the non-display area.

16. A display device, comprising:
a display panel comprising first and second substrates which face each other;
a window part disposed on the display panel and which comprises a light-blocking region disposed at an edge region thereof;
an adhesive part disposed between the display panel and the window part; and a plurality of optical patterns disposed on an edge region of a bottom surface of the first substrate,
wherein the first substrate comprises at least one of first and second inclined surfaces, which are respectively defined near corners of a top surface and the bottom surface of the first substrate.

17. The display device of claim 16, wherein the first inclined surface is inclined at an angle of 120 to 150 degrees, relative to the top surface of the first substrate.

18. The display device of claim 16, wherein the second inclined surface is inclined at an angle of 30 to 60 degrees, relative to the top surface of the first substrate.

19. The display device of claim 16, wherein the optical patterns are disposed on a region corresponding to the light-blocking region.

20. The display device of claim 16, wherein the display panel comprises a display area and a non-display area adjacent to the display area, and the optical patterns are disposed on a region corresponding to the non-display area.

\* \* \* \* \*